United States Patent
Cheng

(10) Patent No.: US 8,292,382 B2
(45) Date of Patent: Oct. 23, 2012

(54) RAIL SET ASSEMBLY FOR A MACHINE CASING OF THE INDUSTRIAL COMPUTER

(75) Inventor: Chi-Tsun Cheng, Taipei County (TW)

(73) Assignee: Lif J. K. Corporation, New Taipei (TW)

( * ) Notice: Subject to any disclaimer, the term of this patent is extended or adjusted under 35 U.S.C. 154(b) by 1139 days.

(21) Appl. No.: 12/168,914

(22) Filed: Jul. 8, 2008

(65) Prior Publication Data

US 2010/0007255 A1 Jan. 14, 2010

(51) Int. Cl.
A47B 88/04 (2006.01)

(52) U.S. Cl. ..................................... 312/334.4

(58) Field of Classification Search .......... 312/334.4, 312/334.5, 334.7, 334.8, 330.1, 334.1; 211/26, 211/126.15, 192
See application file for complete search history.

(56) References Cited

U.S. PATENT DOCUMENTS

| | | | | |
|---|---|---|---|---|
| 5,833,337 | A * | 11/1998 | Kofstad | 312/334.5 |
| 6,223,908 | B1 * | 5/2001 | Kurtsman | 211/26 |
| 6,655,534 | B2 * | 12/2003 | Williams et al. | 211/26 |
| 6,736,277 | B2 * | 5/2004 | Lauchner et al. | 211/26 |
| 6,811,039 | B2 * | 11/2004 | Chen et al. | 211/26 |
| 6,863,188 | B2 * | 3/2005 | Besserer et al. | 211/183 |
| 6,948,691 | B2 * | 9/2005 | Brock et al. | 248/222.13 |
| 6,957,878 | B2 * | 10/2005 | Greenwald et al. | 312/334.4 |
| 6,974,037 | B2 * | 12/2005 | Haney | 211/26 |
| 7,284,672 | B2 * | 10/2007 | Tsai | 211/208 |
| 7,494,101 | B2 * | 2/2009 | Chen | 248/298.1 |
| 7,703,734 | B2 * | 4/2010 | Chen et al. | 248/298.1 |
| 7,740,329 | B2 * | 6/2010 | Hsiung et al. | 312/334.4 |
| 7,780,253 | B1 * | 8/2010 | Lu | 312/334.4 |
| 2003/0019824 | A1 * | 1/2003 | Gray | 211/26 |
| 2005/0155941 | A1 * | 7/2005 | Hartman et al. | 211/26 |
| 2005/0189855 | A1 * | 9/2005 | Naue et al. | 312/334.4 |
| 2005/0285492 | A1 * | 12/2005 | Hu et al. | 312/334.4 |
| 2006/0152115 | A1 * | 7/2006 | Dubon et al. | 312/334.8 |
| 2007/0025812 | A1 * | 2/2007 | Tsai | 403/353 |
| 2007/0235402 | A1 * | 10/2007 | Chen et al. | 211/192 |
| 2008/0036347 | A1 * | 2/2008 | Liang | 312/334.5 |

* cited by examiner

Primary Examiner — James O Hansen
Assistant Examiner — Matthew Ing

(57) ABSTRACT

A rail set assembly includes following elements. A retainer is capable of being fixed to a frame by a bending portion thereof and thus to provide a supporting force to the rail. The retainer further has a positioning locking hole. An engaging unit has a plurality of through holes and bending sides on each of a long upper side and a long lower side. The engaging unit can further retain the retainer in a certain position. A sliding track has a front fixing unit, a rear post, a long slot at a central part thereof. The sliding track further has a bending portion on each of an upper and a lower side of the track, and the sliding track is parallel and slidable along the engaging unit. An embedding unit has a guide block and a positioning block.

4 Claims, 7 Drawing Sheets

RAIL SET ASSEMBLY FOR A MACHINE CASING OF THE INDUSTRIAL COMPUTER

FIELD OF THE PRESENT INVENTION

The present invention relates to a rail set, and especially to a rail set assembly for a machine casing of the industrial computer field.

DESCRIPTION OF THE PRIOR ART

A lot of designs of sliding guide and rail set are provided in the market nowadays. A prior art of simple drawable function as a normal drawer provided to users in the beginning is not adaptable to a larger machine casing in industry. Therefore, various designs with special functions are developed.

For example, one prior art relates to sliding guide retrieval and positioning structure. It includes an outer guide and an inner guide with column sheets, respectively, and a first unit and a second unit with arranging holes respectively. The first unit has a positioning hole with an approximately C shape opening for buckling by the second unit. The opening of the positioning hole is smaller than a bottom of the positioning hole, and the second unit has an embedding block with a larger head portion and a small root portion. When the inner guide is retrieved toward the outer guide, the embedding block can enlarge the opening of the positioning hole and fit into the bottom thereof so as to buckle and fix the retrieved structure.

Another prior art relates to three steps sliding guide positioning structure. It includes a moving guide, a middle guide, and a fixed guide. The positioning function of the three steps sliding guide is performed by the positioning device formed in a linking position of the middle guide and the fixed guide in an extending status. The invention also provides the positioning and locking function through an embedding unit and a buckle, but it is more complicated because of a special angle and structure.

In accordance with various machine casing rails, the inventor accomplished a rail set design of the present invention which is more practical and different from the above patents.

SUMMARY OF THE PRESENT INVENTION

Accordingly, the primary object of the present invention is to provide a rail set assembly with adjustable positioning function. A sliding track can slide between a retainer and an embedding unit and slide within the maximum range confined by a positioning block of the embedding unit. The sliding range is adjustable by selecting any of the through holes on the engaging unit to fix to a positioning locking hole of the retainer.

The secondary object of the present invention is to provide a multiple steps rail function. A drawable rail set can be used in the front of the present invention so as to provide a multiple steps and positioning functions.

To achieve above object, the present invention provides a rail set assembly includes following elements. A retainer is capable of being fixed to a frame by a bending portion thereof and thus to provide a supporting force to the rail. The retainer further has a positioning locking hole. An engaging unit has a plurality of through holes and bending sides on each of a long upper side and a long lower side. The engaging unit can further retain the retainer in a certain position. A sliding track has a front fixing unit, a rear post, a long slot at a central part thereof. The sliding track further has a bending portion on each of an upper and a lower side of the track, and the sliding track is parallel and slidable along the engaging unit. An embedding unit has a guide block and a positioning block. In assembly, the engaging unit is engaged to the retainer and the sliding track slides into the engaging unit. A locking stud passes through and locks the embedding unit and the engaging unit.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
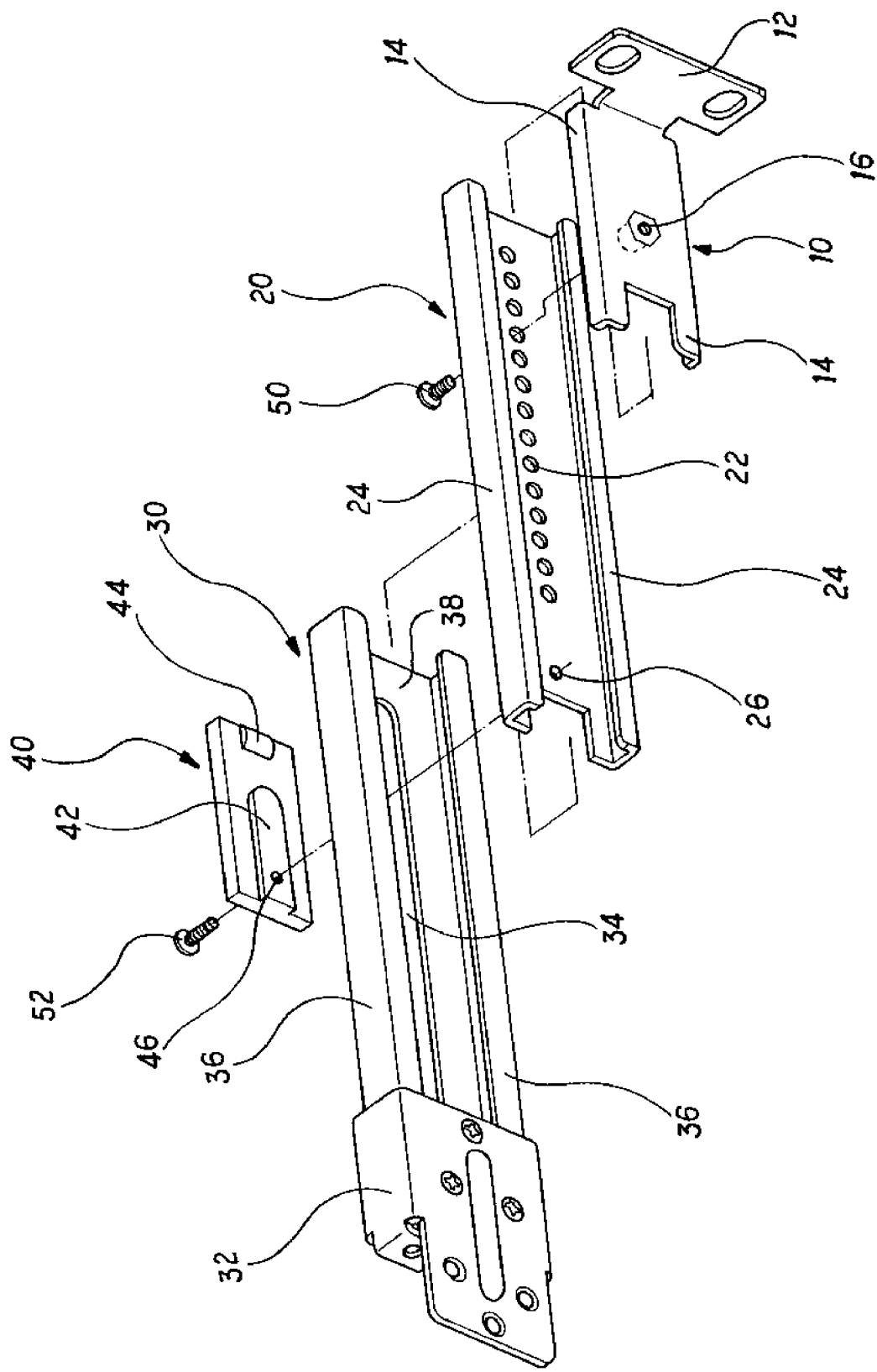
FIG. 1 is an exploded schematic view of the present invention.

With reference to FIG. 1, an exploded view of the present invention is illustrated. A set of parallel rails installed on a frame and a drawable machine casing. Each rail has a retainer 10, an engaging unit 20, a sliding track 30 and an embedding unit 40.

The retainer 10 has a bending portion 12 bending from a body thereof so that the retainer 10 is fixed to a frame by the bending portion 12 thereof and thus to provide a supporting force to the rail. Each of an upper and a lower side of the retainer 10 are bent to be as a bending side 14 for providing a wide connecting surface. A central portion of the retainer 10 has a positioning locking hole 16 for receiving a locking stud 50.

The engaging unit 20 has a plurality of through holes 22 and a penetrating hole 26. Each of a long upper side and a long lower side is formed as a bending side 24. A locking stud 50 passes through one of the through hole 22 of the engaging unit 20 and the locking hole 16 of the retainer 10 so as to retain the engaging unit 20 to the retainer 10 in different position.

The sliding track 30 has a front fixing unit 32. A central part thereof has a long slot 34. A rear end thereof has a rear post 38. Each of an upper and a lower side of the track 30 is bent as a bending portion 36. After assembly, the sliding track 30 is slidable along the engaging unit 20 and has a confined sliding length by other elements.

The embedding unit 40 has a through hole 46, a guide block 42 and a positioning block 44 having a convex cambered surface. In assembly, the guiding block 42 will be engaged into the long slot 34 so as to provide the sliding track 30 to slide steadily and a positioning function as it moves forwards.

The positioning block 44 provides a positioning function in forward and backward movements.

In assembly, the engaging unit 20 is engaged to the retainer 10. The locking stud 52 passes through the through hole 46 of the embedding unit 40 and the penetrating hole 26 of the engaging unit 20 so that the embedding unit 40 is locked to the engaging unit 20. Thus the sliding track 30 is slidable along the engaging unit 20 and the embedding unit 40 so as to have a maximum sliding length.

Figure 2:
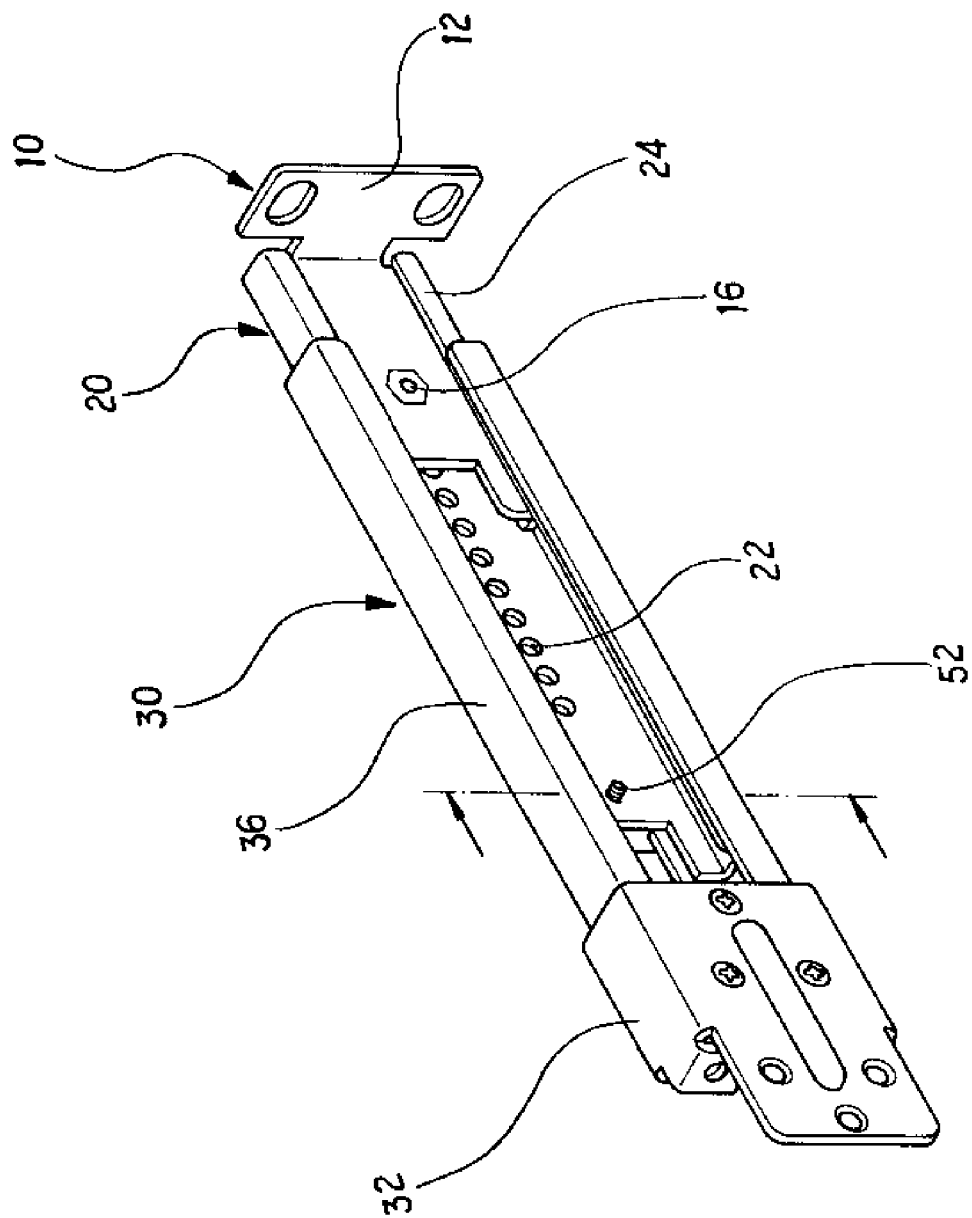
FIG. 2 is an assembly schematic view of the present invention.
Figure 3:
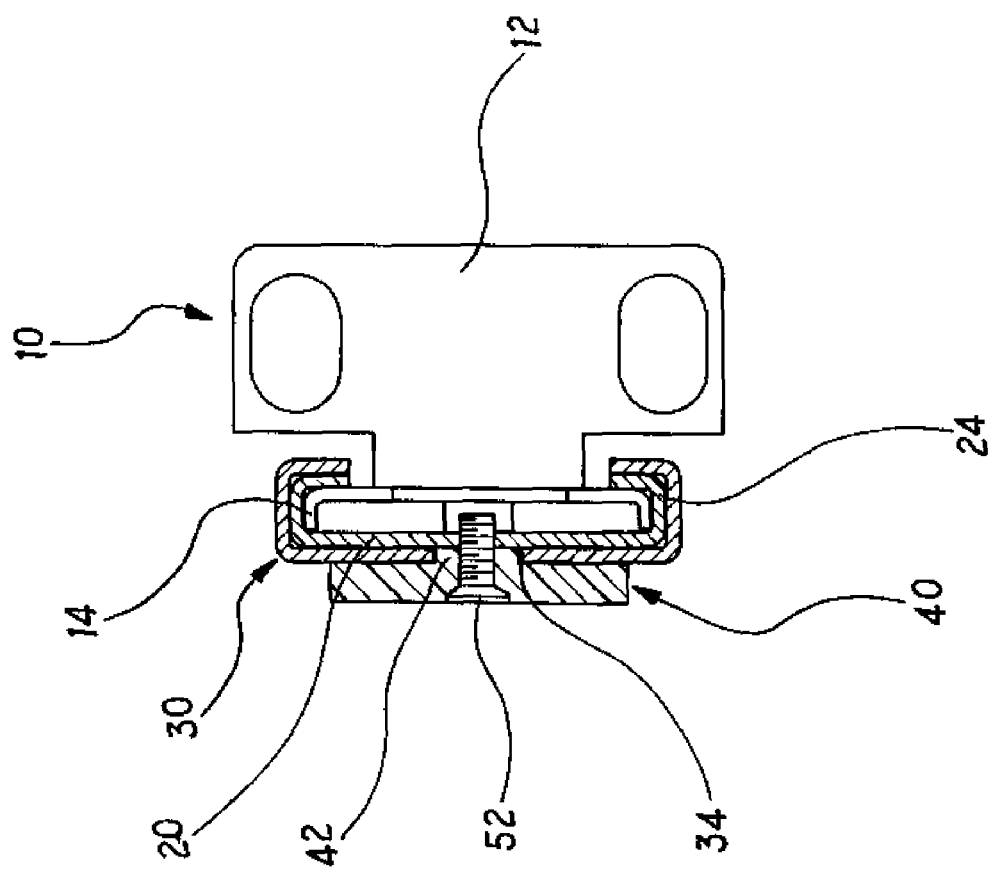
FIG. 3 is an A-A' cross section view of the present invention.

Referring to FIGS. 2 and 3, the retainer 10 is fixed on the engaging unit 20 by the stud 50 to passes through and be fixed to the positioning locking hole 16 of the retainer 10 and one of the through holes 22 of the engaging unit 20. With reference of the FIG. 2, the retainer 10 is fixed by a stud to pass through one of the rear through holes 22, and then the sliding track 30 slides into the engaging unit 20. The embedding unit 40 is arranged on the opposite side against the engaging unit 20 of the sliding track 30. The locking stud 52 passes through the through hole 46 of the embedding unit 40 and the penetrating hole 26 of the engaging unit 20 so that the embedding unit 40 is locked to the engaging unit 20. Therefore, the retainer 10 fixed on a rack is not movable to the engaging unit 20, and the embedding unit 40 is also locked to the engaging unit 20. Thus the sliding track 30 is slidable along the engaging unit 20 and the embedding unit 40 so as to have a maximum sliding length.

Figure 4:
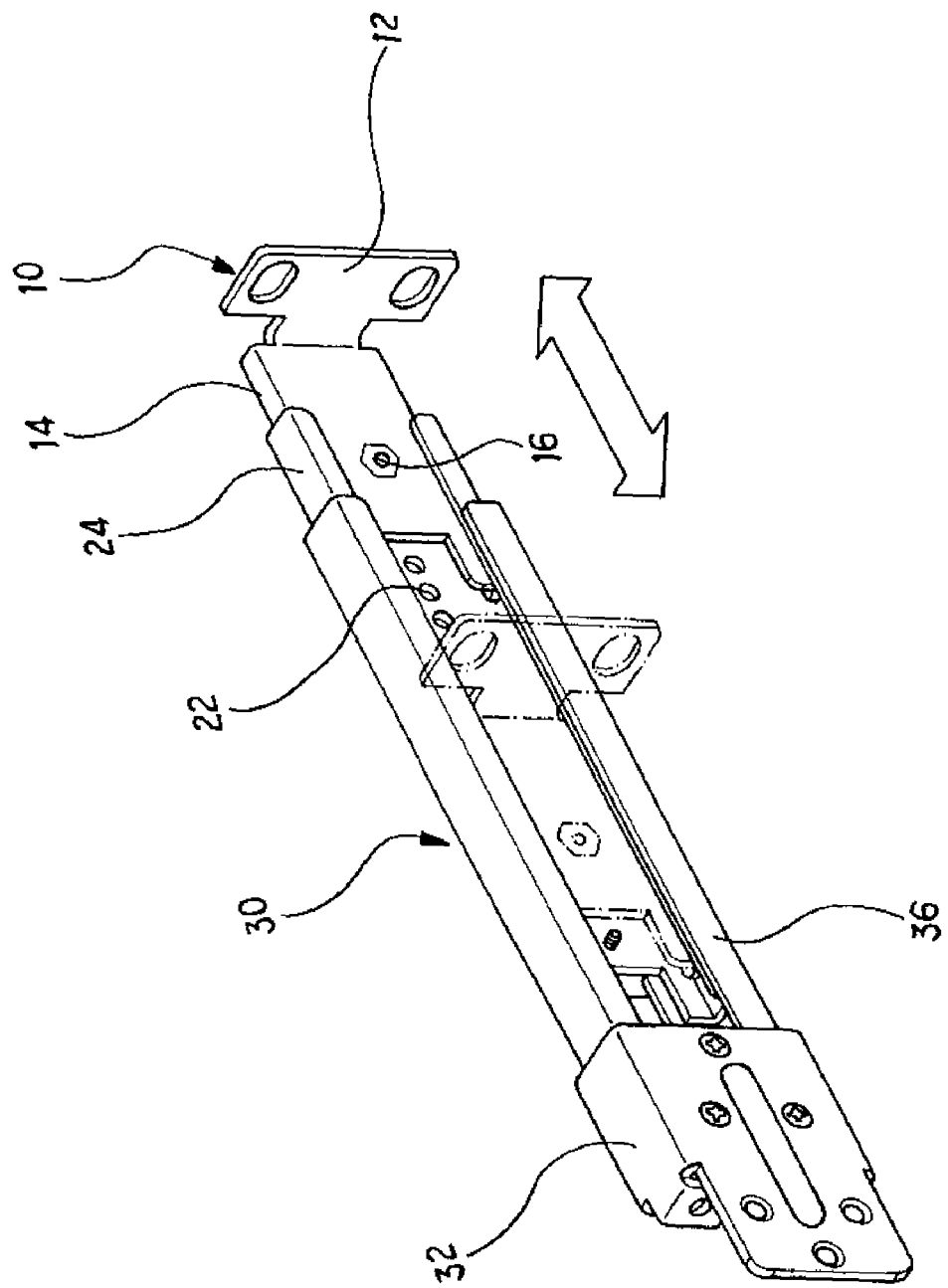
FIG. 4 is a schematic view showing the adjustable locking position of the present invention.

Comparing with the FIG. 2, the retainer 10 illustrated in the FIG. 4 is fixed through a through hole near to the penetrating hole 26. When the sliding track 30 is sliding toward the retainer 10, it will reach the retainer 10 and the embedding unit 40 and stop. Thus the sliding length of the sliding track 30 will become shorter between the engaging unit 20 and the embedding unit 40.

Figure 5:
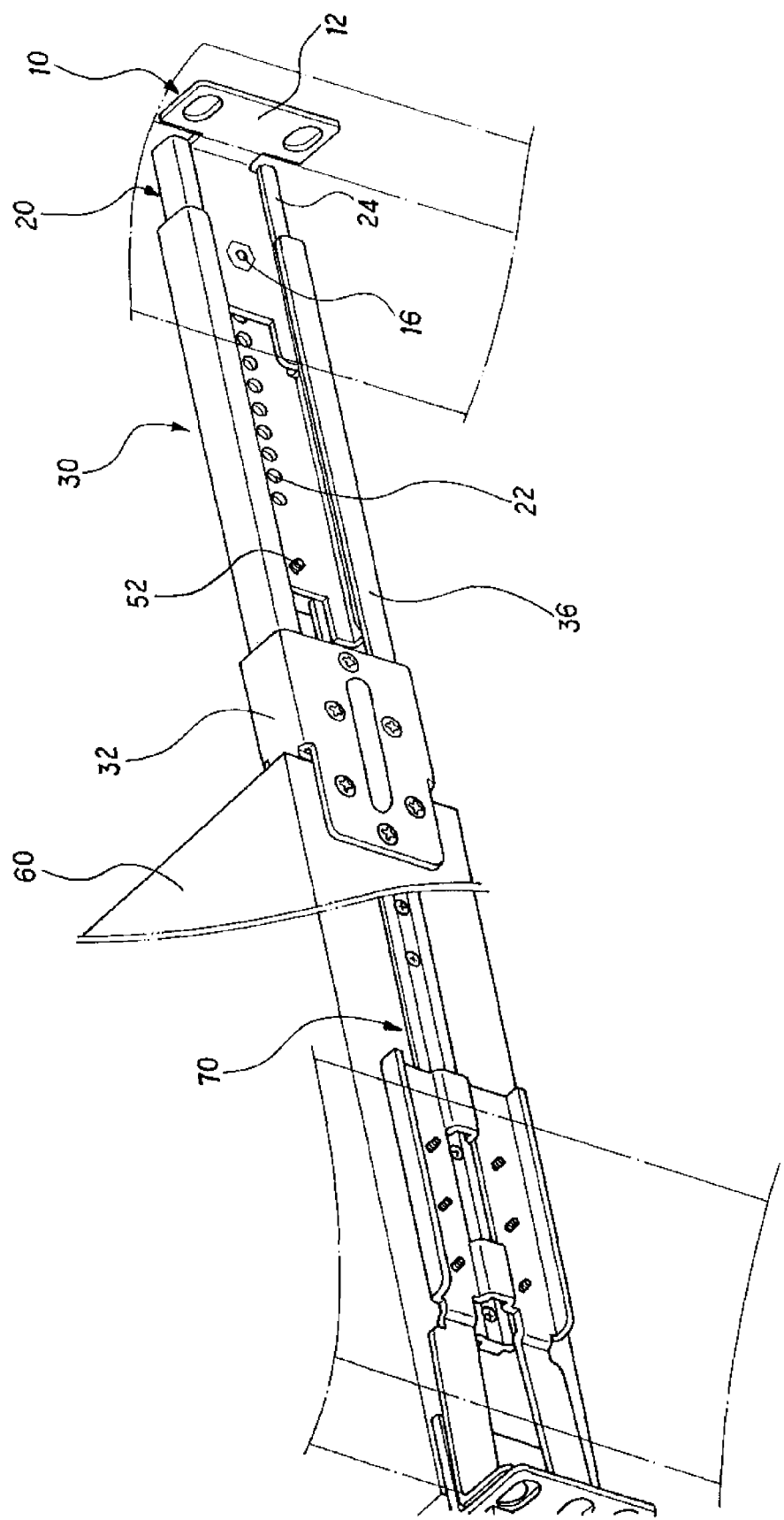
FIG. 5 is a schematic view showing a combination with a front rail set of the present invention.

The present invention can be combined with other rail set as shown in FIG. 5. The drawable machine casing 60 is locked to the front fixing unit 32. A side of the drawable machine casing 60 can be arranged by another rail set 70. By the assembly, the drawable machine casing 60 can be drawn out of the frame easily and smoothly, in the same time another sliding force applying and positioning stop are provided as well as a function of multiple steps sliding.

Figure 6:
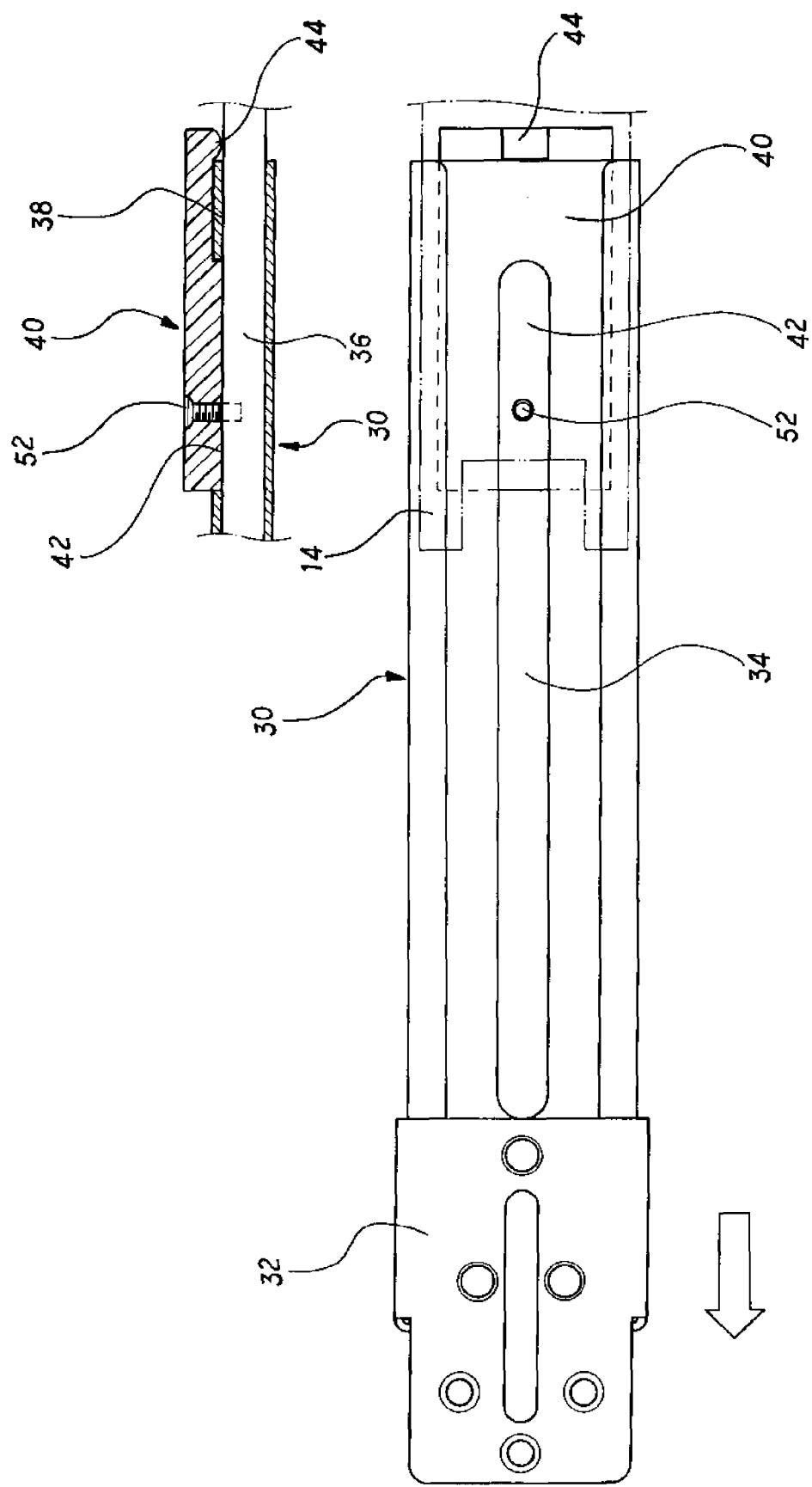
FIGS. 6 and 7 are a schematic view showing the operation of the present invention.
Figure 7:
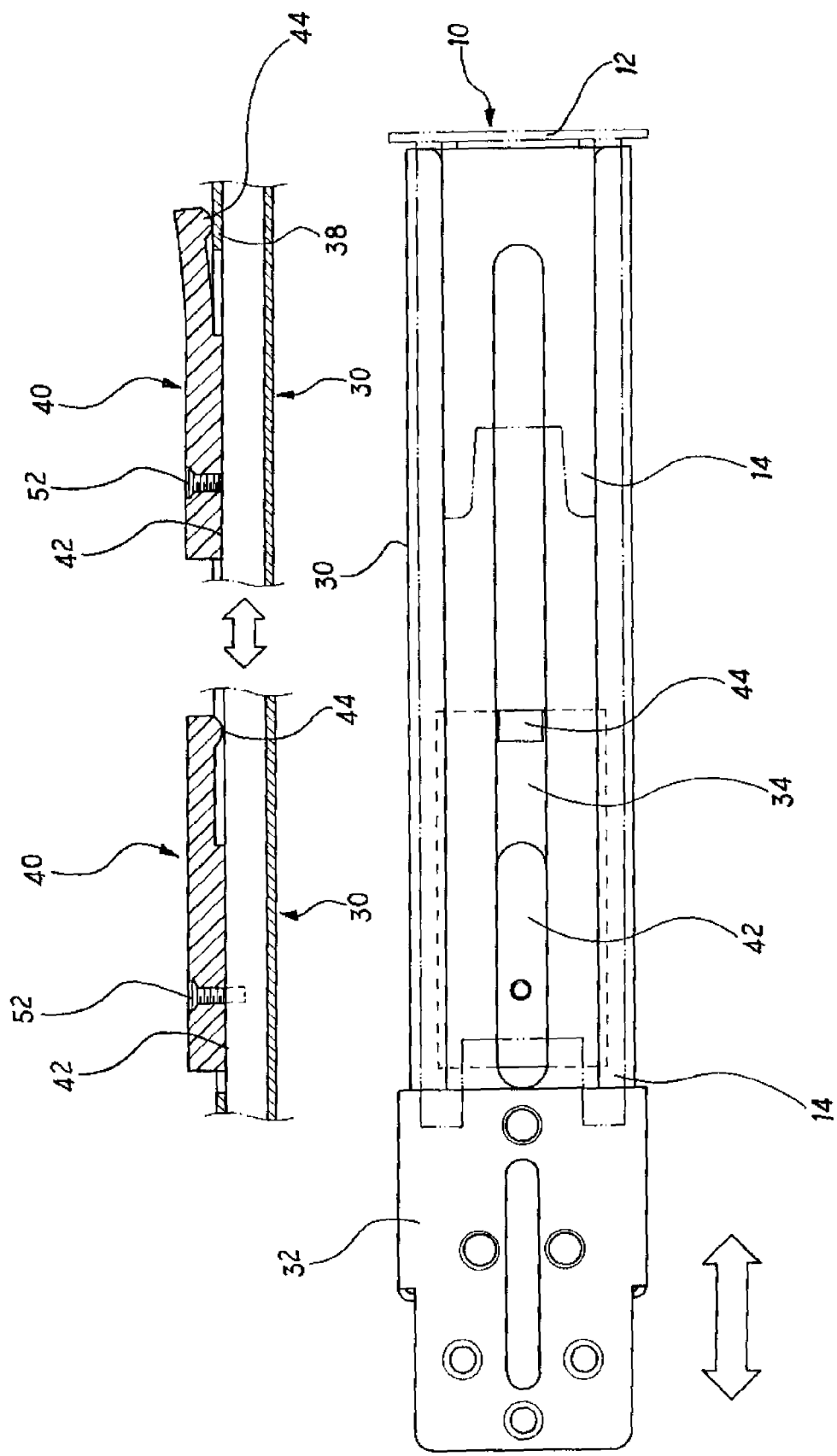

FIGS. 6 and 7 show the sliding operation of the present invention and especially the function of the guide block 42 and the positioning block 44 of the embedding unit 40. As mentioned above, in assembly, the guiding block 42 will be engaged into the long slot 34 so as to provide the sliding track 30 to slide steadily and a positioning function as it moves forwards. When the machine casing is retrieved as shown in FIG. 6 and about to be completely drawn out, the positioning block 44 having a convex cambered surface will hold a resistance against the sliding track 30. Under a continue force applied by a user, the casing can be drawn out and a sound of the bounce of the materials can be heard. It means that the positioning block 44 has been passed through by a rear post 38 which is a rear end of the long slot 34 of the sliding track 30. After that, the rear post 38 will reach to the guide block 42 and encounter another resistance so that the sliding track 30 can not be drawn out anymore under further force applied by the user.

With reference of the FIG. 7 showing the retrieval of the drawable machine casing, a pushing force is applied to the present invention. The positioning block 44 having a convex cambered surface will still hold a resistance against the sliding track 30. Under a continue force applying by a user, the casing can be pushed backward and a sound of the bounce of the materials can be heard. It means that the positioning block 44 has been reversely passed through by the rear post 38 of the sliding track 30. After that, a front end of the long slot 34 will reach to the guide block 42 and encounter another resistance so that the sliding track 30 can not be pushed anymore under further force applying by the user.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A rail set assembly having two parallel rails installed on a frame and a drawable machine casing; each rail comprising:
   a retainer having a bending portion bending from a body thereof so that the retainer is fixed to a frame by the bending portion thereof and thus to provide a supporting force to the rail; a central portion of the retainer having a locking hole;
   an engaging unit having a plurality of through holes and a penetrating hole, a first locking stud passing through one of the through holes of the engaging unit and the locking hole of the retainer so as to retain the engaging unit to the retainer in different positions;
   a sliding track, having a front fixing unit and a long slot whose length is longer than a half of length of the sliding track, and the sliding track being slidable along the engaging unit;
   an embedding unit, being a rectangular plate, having a passing hole and a guide block longitudinally protrudent from a side of the embedding unit, wherein the guide block will be engaged into the long slot so as to provide the sliding track to slide steadily and a positioning function as it moves forwards; and
   wherein the engaging unit is engaged to the retainer; a second locking stud passes through the passing hole of the embedding unit and the penetrating hole of the engaging unit so that the embedding unit is locked to the engaging unit; and thus the sliding track is slidable along the engaging unit and the embedding unit; and
   wherein the embedding unit further has a positioning block on the same side the guide block is formed and with a convex cambered surface; and the positioning block provides a positioning function in forward and backward movements.

2. The rail set assembly as claimed in claim 1, wherein each of an upper and a lower side of the retainer is bent to be as a bending side for providing a wide connecting surface.

3. The rail set assembly as claimed in claim 1, wherein each of a long upper side and a long lower side is formed as a bending side.

4. The rail set assembly as claimed in claim 1, wherein each of an upper and a lower side of the track is bent as a bending portion.

* * * * *